United States Patent [19]
Chen et al.

[11] Patent Number: 6,099,705
[45] Date of Patent: Aug. 8, 2000

[54] PHYSICAL VAPOR DEPOSITION DEVICE FOR FORMING A UNIFORM METAL LAYER ON A SEMICONDUCTOR WAFER

[75] Inventors: Hsueh-Chung Chen, Yungho; Juan-Yuan Wu, Hsin-Chu; Water Lur, Taipei, all of Taiwan

[73] Assignee: United Microelectronics Corp., Hsin-Chu, Taiwan

[21] Appl. No.: 09/391,323

[22] Filed: Sep. 8, 1999

[51] Int. Cl.⁷ .......................... C23C 14/38; C23C 14/40; C23C 14/42; C23C 14/44

[52] U.S. Cl. ................. 204/298.06; 204/298.08; 204/298.12; 204/298.15; 204/298.02; 118/723 E; 118/723 I; 118/728; 118/723 R

[58] Field of Search .................. 204/298.06, 298.08, 204/298.12, 298.15, 298.18, 298.02; 118/723 E, 723 I, 728, 723 R

[56] References Cited

U.S. PATENT DOCUMENTS

| | | | |
|---|---|---|---|
| 5,178,739 | 1/1993 | Barnes et al. | 204/192.12 |
| 5,707,498 | 1/1998 | Ngan | 204/192.12 |
| 5,961,793 | 10/1999 | Ngan | 204/192.12 |

*Primary Examiner*—Alan Diamond
*Attorney, Agent, or Firm*—Winston Hsu

[57] ABSTRACT

A physical vapor deposition device comprises a vacuum chamber in which Ar ions are generated, a wafer chuck for holding a circular-shaped semiconductor wafer, a circular-shaped metal target above the wafer, an annular metal coil between the metal target and the wafer and made of the same material as the metal target, and a voltage controller for supplying voltage to the metal target, the wafer chuck and the metal coil. During a PVD processing, the voltage controller generates voltage biases between the metal target and the wafer chuck and between the metal coil and wafer chuck. That causes Ar ions to bombard the metal target to release metal atoms sputtering onto the center portion of the wafer, and causes Ar ions to bombard the metal coil to release the metal atoms sputtering onto the peripheral portion of the wafer so as to create a uniform metal layer on the wafer.

7 Claims, 4 Drawing Sheets

PHYSICAL VAPOR DEPOSITION DEVICE FOR FORMING A UNIFORM METAL LAYER ON A SEMICONDUCTOR WAFER

BACKGROUND OF THE INVENTION

1. Field of the Invention

The present invention relates to a physical vapor deposition (PVD) device, and more particularly, to a PVD device for forming a uniform metal layer on a semiconductor wafer.

2. Description of the Prior Art

The physical vapor deposition process is employed to form a thin metal layer on the semiconductor wafer in the semiconductor fabrication process. The metal layer with no void formed inside and with good uniformity in its thickness is considered as a metal layer with good structure.

Please refer to FIG. 1, FIG. 1 is a schematic diagram of a PVD device 10 according to the prior art. The prior art PVD device 10 comprises a chamber 12 in which air is evacuated and then argon (Ar) gas is introduced for generating Ar ions 18, a wafer chuck 14 for holding a circular-shaped semiconductor wafer 16, and a circular-shaped metal target 17. The PVD device 10 generates a built-in electric field inside the chamber 12, causing the Ar ions 18 bombard the metal target 17 to release metal atoms 19 from the metal target 17. Then, the metal atoms 19 drop onto a semiconductor wafer 16 below the metal target 17 so as to form a metal layer 20 on the semiconductor wafer 16.

Please refer to FIG. 2, FIG. 2 is a schematic diagram of the formation of the metal layer 20 on the semiconductor wafer 16 by using the PVD device 10 shown in FIG. 1. The circles represent the metal atoms 19 released from the metal target 16 caused by ion bombardment, and the arrows represent the directions of the drop of the metal atoms 19 in FIG. 2. During the PVD process for the semiconductor wafer 16 by using the PVD device 10, the directions of the drop of the metal atoms 19 are random. The semiconductor wafer 16 comprises a gap 22, and a gap 24 with a higher aspect ratio. Thus, an overhang issue occurs in the metal layer formed on the top corner of the gap 22, and a void 26 is formed within the metal layer inside the gap 24. Therefore, the metal atoms 19 generated inside the PVD device 10 have worse gap-filling capability for forming the metal layer.

Please refer to FIG. 3 and FIG. 4, FIG. 3 is a schematic diagram of a PVD device 30 with a collimator according to the prior art. FIG. 4 is a schematic diagram of the formation of a metal layer 40 on a semiconductor wafer 36 by using the PVD device 30 shown in FIG. 3. The difference between the PVD device 30 and the PVD device 10 is that the PVD device 30 further comprises a collimator 38 having many parallel pipes. The collimator 38 obstructs the metal atoms released from the circular-shaped metal target 37 and causes the metal atoms to drop in vertical directions. When the PVD device 30 is employed to process PVD on the semiconductor wafer 36 comprising gaps, most of the random metal atoms are obstructed by the collimator 38, but a few metal atoms 19 drop onto the semiconductor wafer 36 in the vertical direction. Therefore, less overhang issue occurs in the metal layer 40 formed on the semiconductor wafer 36. That is the metal atoms 19 generated in the PVD device 30 have better gap-filling capability for forming the metal layer. However, since most of the random metal atoms are obstructed and remained in the collimator 38, the collimator 38 need to be scoured or replaced regularly, resulting in the increases of time and costs of the PVD process.

Please refer to FIG. 5, FIG. 5 is a schematic diagram of an ionized metal plasma (IMP) PVD device 50 according to the prior art. The difference between the IMP PVD device 50 and the PVD device 10, 30 is that the IMP PVD device 50 comprises an annular metal coil 58 positioned between the metal target 57 and the wafer chuck 54. During a PVD processing by using the IMP PVD device 50, an AC (alternating current) voltage of radio frequency is supplied to the metal coil 58 to generate a magnetic field in the cylindrical region surrounded by the metal coil 58. The built-in electric field of the IMP PVD device 50 causes the Ar ions to bombard the circular-shaped metal target 57 to release the metal atoms from the circular-shaped metal target 57 inside the chamber 52. Meanwhile, the magnetic field causes the Ar ions to move in a spiral direction to increase collisions between the Ar ions and the released metal atoms, resulting in the reduction of the mean free path of the Ar ions and the ionization of the metal atoms. Then, the vertical built-in electric field in the PVD device 50 causes the ionized metal atoms to increase their dropping velocity of in the vertical direction, and relatively decrease their dropping velocity in other directions. Therefore, the metal atoms created in the IMP PVD device 50 have better gap-filling capability during sputtering the semiconductor wafer.

Please refer to FIG. 6, FIG. 6 is a schematic diagram to show the relative thickness along line a—a of the metal layer formed on the semiconductor wafer in the IMP PVD device shown in FIG. 5. Because the size of the chamber 52 for the IMP PVD device 50 is fixed, which limits the size of the annular metal coil 58, so that the thickness of the metal layer formed on the peripheral portion of the semiconductor wafer 56 is smaller than that of the metal layer formed on the center portion of the semiconductor wafer 56. Consequently, the metal layer formed on the semiconductor wafer 56 by using the IMP PVD device 50 has poor uniformity for its thickness.

SUMMARY OF THE INVENTION

It is therefore a primary objective of the present invention to provide a physical vapor deposition device for forming a uniform metal layer on a semiconductor wafer in which the metal atoms generated having better gap-filling capability when sputtering the semiconductor wafer so as to create a uniform metal layer.

In a preferred embodiment, the present invention provides a physical vapor deposition device for forming a uniform metal layer on a semiconductor wafer comprising:

a vacuum chamber in which air is evacuated and then argon (Ar) gas is introduced for generating Ar ions;

a wafer chuck positioned in the vacuum chamber for holding a circular-shaped semiconductor wafer;

a circular-shaped metal target positioned inside the vacuum chamber and above the semiconductor wafer;

an annular metal coil positioned inside the vacuum chamber between the metal target and the semiconductor wafer and made of the same material as the metal target; and a voltage controller for supplying voltage to the metal target, the wafer chuck and the metal coil;

wherein during a PVD processing, the voltage controller supplies DC (direct current) voltages to the metal target, the wafer chuck and the metal coil to generate voltage biases between the metal target and the wafer chuck and between the metal coil and wafer chuck, causing Ar ions to bombard the metal target to release metal atoms from the metal target and sputter them onto the center portion of the semiconductor wafer, and causing Ar ions to bombard the metal coil to cause the release of metal atoms from the metal coil and sputter them onto the peripheral portion of the semiconductor wafer so as to create a uniform metal layer on the semiconductor wafer.

It is an advantage of the present invention that the annular metal coil improves the gap-filling capability of the metal atoms when sputtering the semiconductor wafer. Also, the present invention employs the annular metal coil as the sub-metal target to sputter the peripheral portion of the semiconductor wafer, therefore, a uniform metal layer on the semiconductor wafer can be created.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
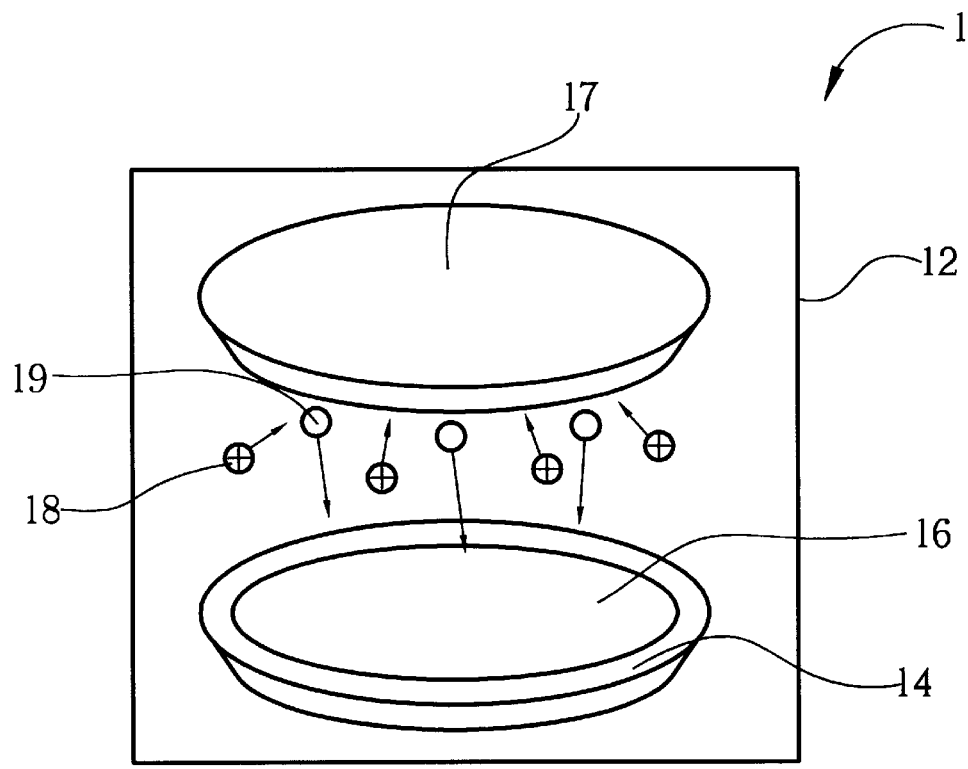
FIG. 1 is a schematic diagram of a PVD device according to the prior art.
Figure 2:
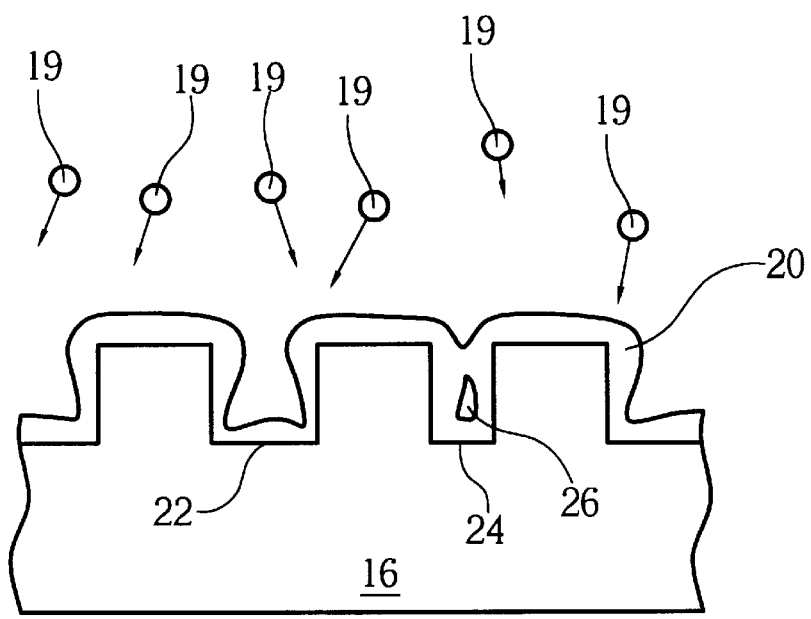
FIG. 2 is a schematic diagram of the formation of the metal layer on a semiconductor wafer in the PVD device shown in FIG. 1.
Figure 3:
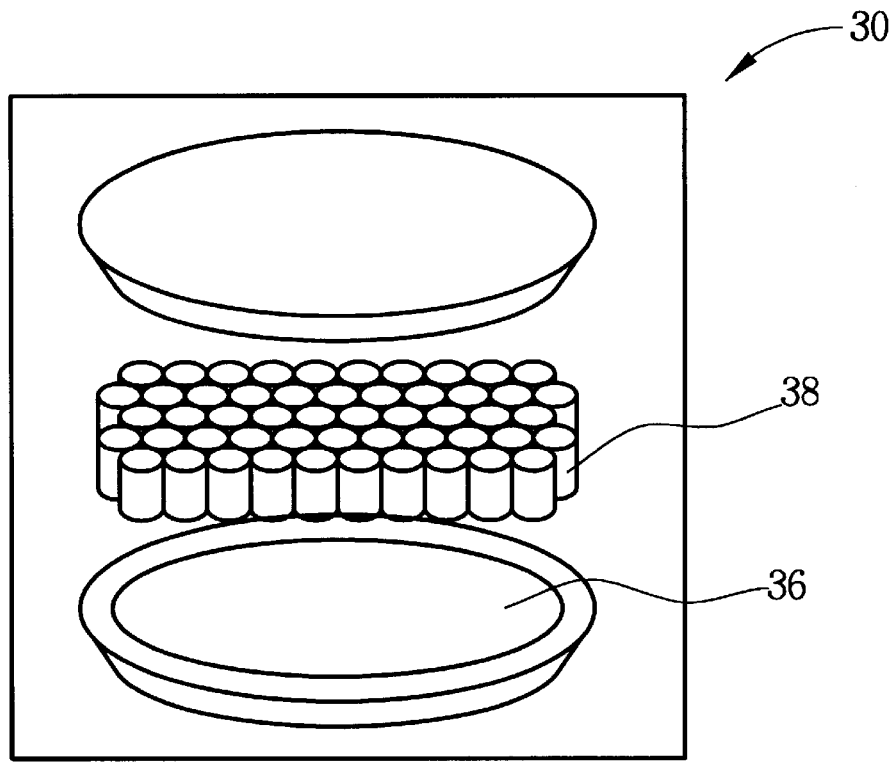
FIG. 3 is a schematic diagram of a PVD device with a collimator according to the prior art.
Figure 4:
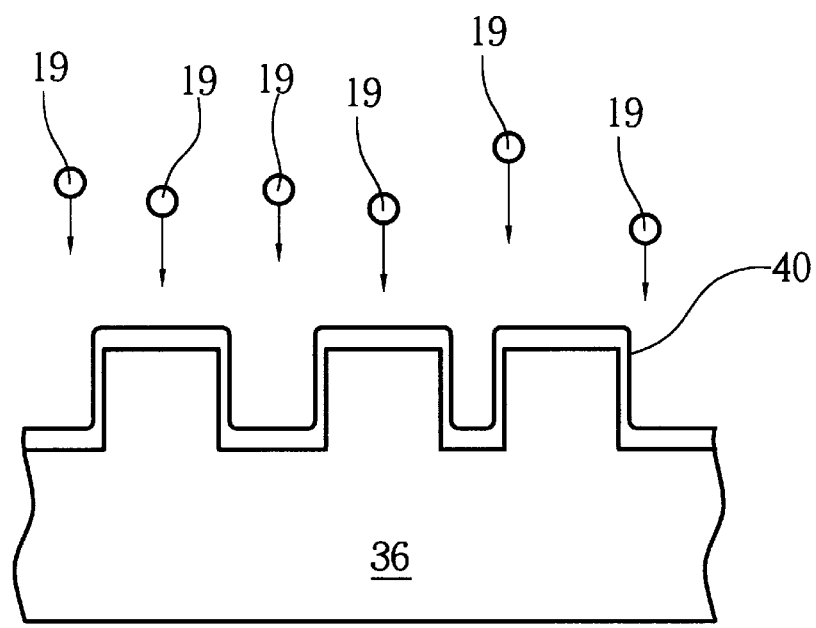
FIG. 4 is a schematic diagram of the formation of the metal layer on the semiconductor wafer in the PVD device shown in FIG. 3.
Figure 5:
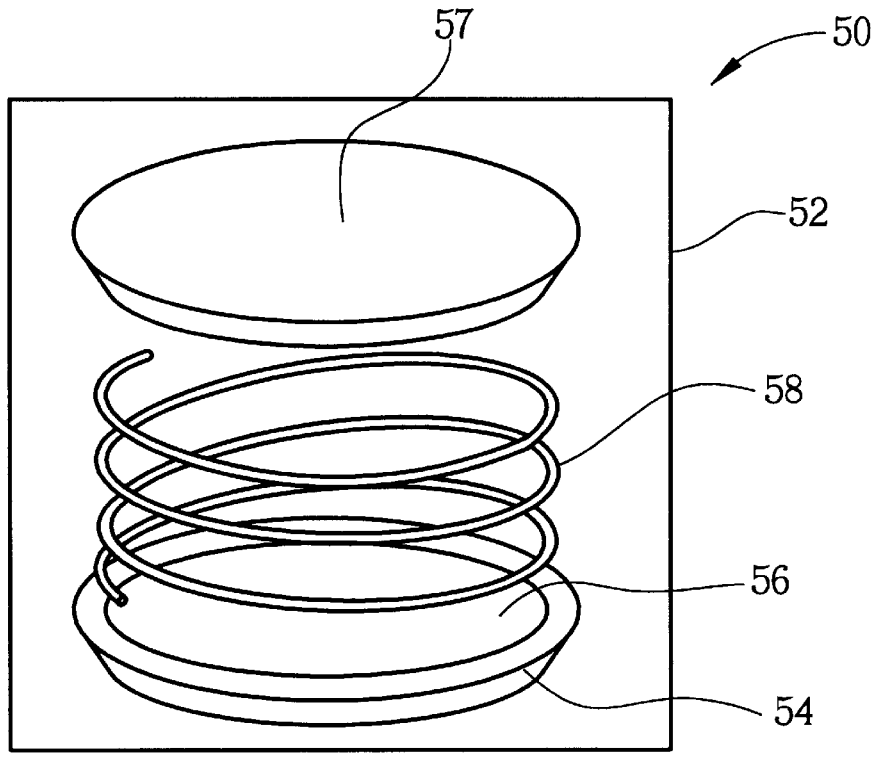
FIG. 5 is a schematic diagram of an ionized mental plasma PVD device according to the prior art.
Figure 6:
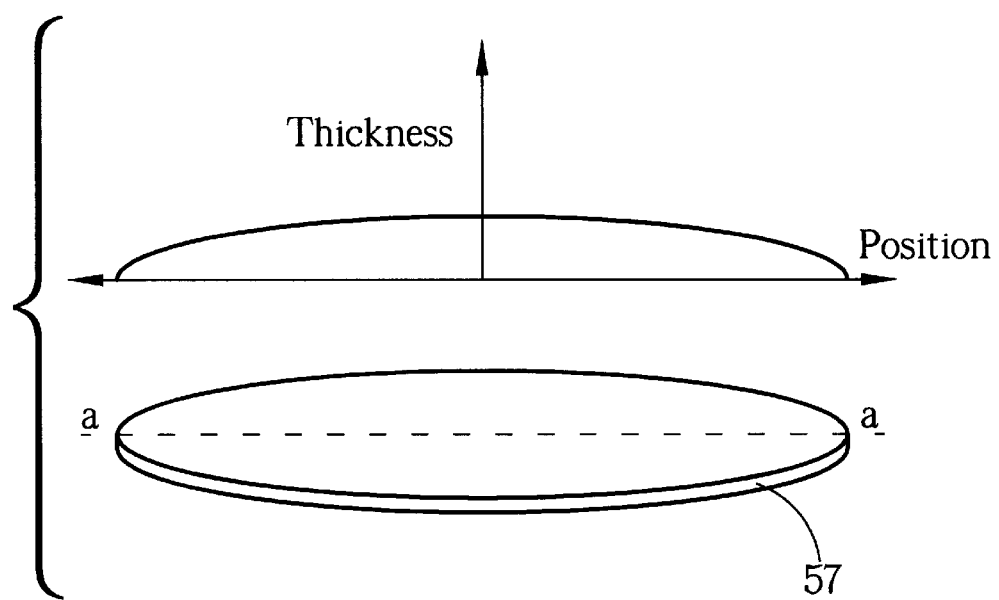
FIG. 6 is a schematic diagram to show the relative thickness along line a—a of the metal layer formed on the semiconductor wafer in the IMP PVD device shown in FIG. 5.
Figure 7:
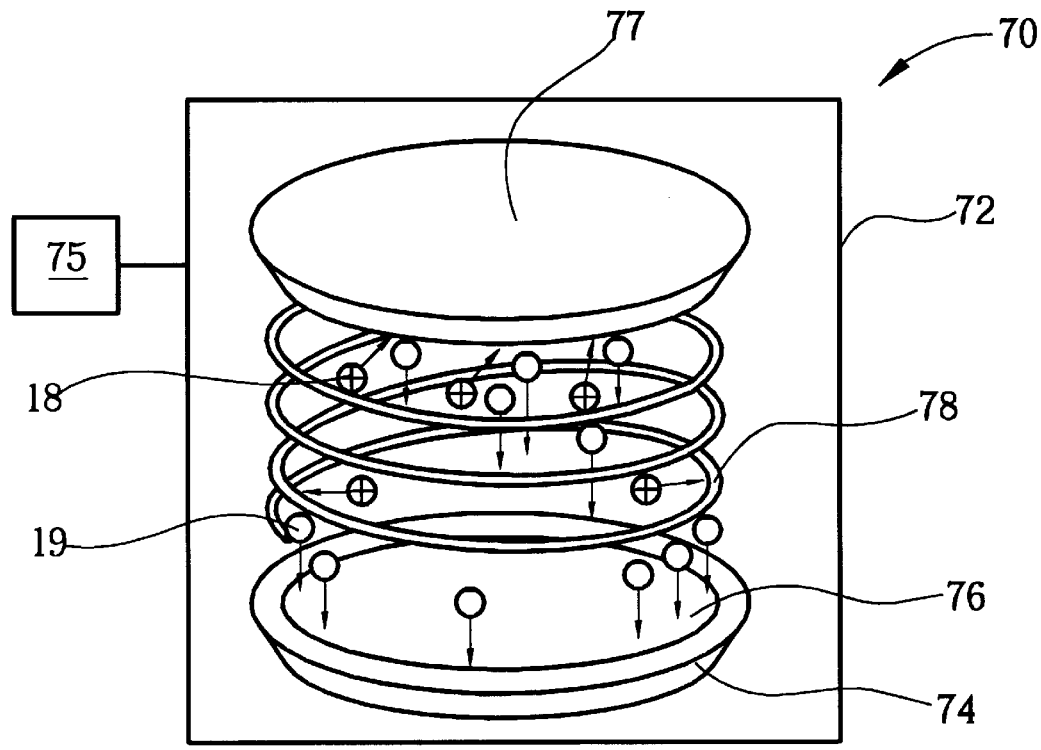
FIG. 7 is a schematic diagram of a PVD device for forming a uniform metal layer on a semiconductor wafer according to the present invention.

Please refer to FIG. 7, FIG. 7 is a schematic diagram of a PVD device 70 for forming a uniform metal layer on a semiconductor wafer according to the present invention. The PVD device 70 according to the present invention comprises a vacuum chamber 72 in which air is evacuated and then Ar gas is introduced for generating Ar ions 18, a wafer chuck 74 positioned in the vacuum chamber 72 for holding a circular-shaped semiconductor wafer 76, a circular-shaped metal target 77 positioned inside the vacuum chamber 72 and above the semiconductor wafer 76, an annular metal coil 78 positioned inside the vacuum chamber 72 between the metal target 77 and the semiconductor wafer 76, and a voltage controller 75 for supplying voltage to the metal target 77, the wafer chuck 74 and the metal coil 78. The annular metal coil 78 and the metal target 77 are made of the same material such as copper (Cu), titanium (Ti) or tantalum (Ta). The air pressure of the vacuum 72 is maintained between 30 to 50 mTorr during the PVD processing.

During a PVD processing by using the PVD device 70 according to the present invention, the voltage controller 75 supplies DC (direct current) voltages to the metal target 77, the wafer chuck 74 and the metal coil 78. Thus, the voltage controller 75 generates voltage biases between the metal target 77 and the wafer chuck 74, and between the metal coil 78 and wafer chuck 74. That causes Ar ions 18 inside the chamber 72 to bombard the metal target 77 to release metal atoms 19 from the metal target 77 and sputter them onto the center portion of the semiconductor wafer 76, and causes Ar ions 18 inside the chamber 72 to bombard the metal coil 78 to release the metal atoms 19 from the metal coil 78 and sputter them onto the peripheral portion of the semiconductor wafer 76. Because the metal coil 78 is made of the same material as the metal target 77, the metal coil 78 is used as a sub-metal target to release the metal atoms 19 to sputter onto the peripheral portion of the semiconductor wafer 76 so as to create a uniform metal layer on the semiconductor wafer 76.

The voltage controller 75 further supplies AC voltage of radio frequency to the metal coil 78 to generate a magnetic field. The magnetic field causes the Ar ions 18 to move in a spiral direction which increases collisions between the Ar ions 18 and the metal atoms 20 released from the metal target 77 so as to ionize the metal atoms 19. Further, the ionized metal atoms is influenced by the vertical built-in electric field in the PVD device 70 to increase their dropping velocity in the vertical direction, and relatively decrease their dropping velocity in other directions. Therefore, the ionized metal atoms have better gap-filling capability when sputtering the semiconductor wafer 76.

The PVD process by using PVD device 70 comprises two stages. In the first stage, the metal target 77 is used to release the metal atoms and sputters those metal atoms onto the center portion of the semiconductor wafer 76. In the second stage, the metal coil 78 is used to release the metal atoms and sputters those metal atoms onto the peripheral portion of the semiconductor wafer 76. The control method for the two stages is explained in the followings:

The first stage: the voltage controller 75 supplies DC voltage to the metal target 78 and the wafer chuck 74, and supplies AC voltage of radio frequency to the metal coil 78 at the same time. The DC voltages supplied by the voltage controller 75 to the metal target 77 and the wafer chuck 74 are −500 to −1000 volts and −100 to −300, respectively. The frequency of the AC voltage supplied to the metal coil 50 is larger than the ion transition frequency by only 1 to 3 MHz. In the process commonly used the industry, the frequency of the AC voltage is 13.56 MHz and the power of the AC voltage is between 100 to 500W. In this stage, all metal atoms in the chamber 72 are released from the metal target 77. Those metal atoms move through the cylindrical region surrounded by the metal coil 78, and collide with the Ar ions to form the ionized metal atoms 19. The ionized metal atoms 19 have better gap-filling capability when sputtering the semiconductor wafer 76.

The second stage: after performing the first stage for a period of time, a DC voltage is supplied to the metal coil 78 and the wafer chuck 74. The DC voltage supplied by the voltage controller 75 to the metal coil 78 is −100 to −300 volts. After the first stage, some metal atoms have been deposited onto the peripheral portion of the semiconductor wafer 76. In the second stage, the metal coil 78 is further employed to generate metal atoms. The metal atoms in the chamber 72 are released not only from the metal target 77 but also from the metal coil 78 resulting in increasing the thickness of the metal layer on the peripheral portion of the semiconductor wafer 76. Therefore, a uniform metal layer on the semiconductor wafer 76 is created.

Figure 8:
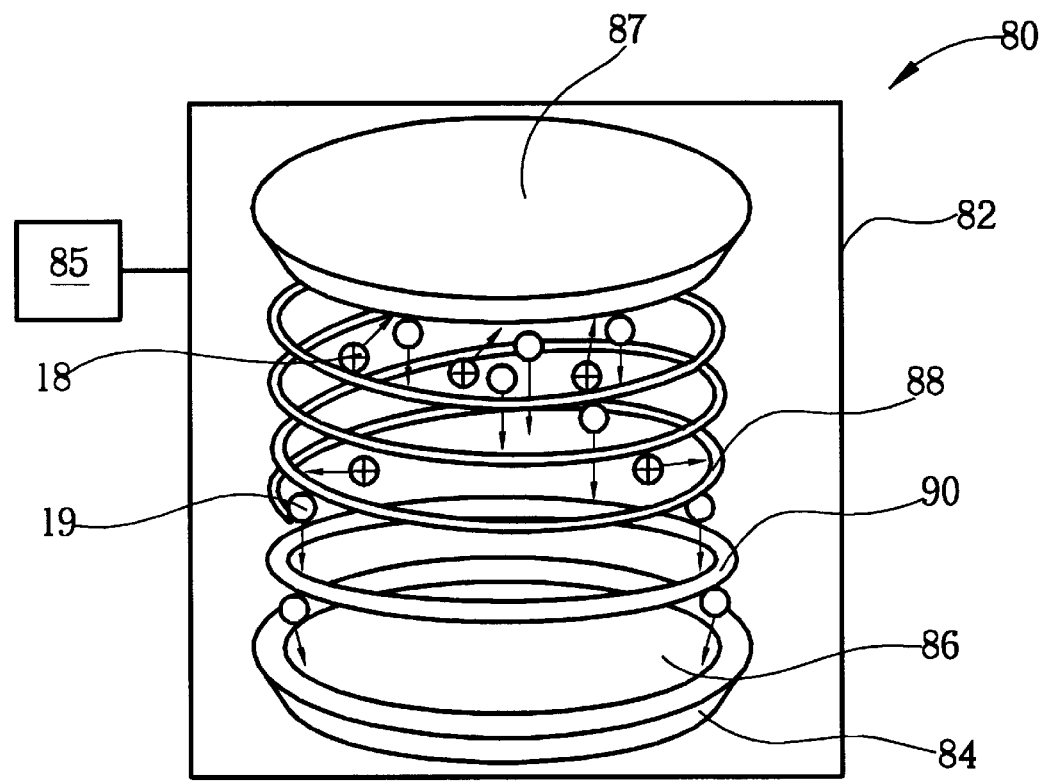
FIG. 8 is an alternative PVD device of the present invention.

Please refer to FIG. 8, FIG. 8 is an alternative PVD device 80 according to the present invention. The metal coil 78 in the PVD device 70 is utilized to not only generate the magnetic field but also be as the sub-metal target. In the PVD device 80, there are different pieces for generating the magnetic field and for being the sub-metal target. Nevertheless, both of two PVD devices can achieve the objective to create a uniform metal layer on a semiconductor wafer. The major difference between the PVD device 80 and the PVD device 70 is that the PVD device 80 further comprises a ring-shaped metal target 90 positioned between the circular metal target 88 and the semiconductor wafer 86 inside the vacuum chamber 80. The ring-shaped metal target 90 is made of the same material as the circular metal target 87. However, the metal coil 88 does not have to be made of the same material as the circular metal target 87. A voltage controller 85 is used to supply voltage to the circular metal target 87, the metal coil 88, the ring-shaped metal target 90 and the wafer chuck 84.

During a PVD processing by using the PVD device 80, the voltage controller 85 supplies DC voltages to the circular metal target 87, the ring-shaped metal target 90 and the wafer chuck 84 to generate voltage biases between the circular metal target 87 and the wafer chuck 84, and between the ring-shaped metal target 90 and the wafer chuck 84. The Ar ions 18 bombard the circular metal target 87 to release the metal atoms from the circular metal target 87 and sputter them approximately onto the center portion of the semiconductor wafer 76 inside the chamber 82. Ar ions also bombard the ring-shaped metal target 90 to release the metal atoms from the ring-shaped metal target 90 and sputter them approximately onto the peripheral portion of the semiconductor wafer in the chamber 82.

The PVD process by using the PVD device 80 also comprises two stages. In the first stage, only the circular metal target 87 is employed to process PVD. The voltage controller 85 supplies the AC voltage of radio frequency to the metal coil 88 to increase collisions between the Ar ions and the released metal atoms so as to ionize the metal atoms 19. Once the metal atoms 19 drop in the vertical direction, they have better gap-filling capability when sputtering the semiconductor wafer 86. In the second stage, not only the circular metal target 87 but also the ring-shaped metal target 90 are employed to increase the thickness of the metal layer on the peripheral portion of the semiconductor wafer 86. Therefore, a uniform metal layer on the semiconductor wafer 86 is created.

In contrast to the prior art PVD devices, the PVD device 70 according to the present invention comprises the annular metal coil to improve the gap-filling capability when forming the metal layer on the semiconductor wafer. Also, the present invention employs the annular metal coil made of the same material as the metal target or the ring-shaped metal target as the sub-metal target to increase the thickness of the metal layer on the peripheral portion of the semiconductor wafer. Therefore, a uniform metal layer on the semiconductor wafer is created.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A physical vapor deposition (PVD) device comprising:
    a vacuum chamber in which air is evacuated and then argon (Ar) gas is introduced for generating Ar ions;
    a wafer chuck positioned in the vacuum chamber for holding a circular-shaped semiconductor wafer;
    a circular-shaped metal target positioned inside the vacuum chamber and above the semiconductor wafer;
    an annular metal coil positioned inside the vacuum chamber between the metal target and the semiconductor wafer and made of the same material as the metal target; and
    a voltage controller for supplying voltage to the metal target, the wafer chuck and the metal coil;
    wherein during a PVD processing, the voltage controller supplies DC (direct current) voltages to the metal target, the wafer chuck and the metal coil to generate voltage biases between the metal target and the wafer chuck and between the metal coil and wafer chuck, causing Ar ions to bombard the metal target to release metal atoms from the metal target and sputter them onto the center portion of the semiconductor wafer, and causing Ar ions to bombard the metal coil to cause the release of metal atoms from the metal coil and sputter them onto the peripheral portion of the semiconductor wafer so as to create a uniform metal layer on the semiconductor wafer.

2. The device of claim 1 wherein the voltage controller first supplies DC voltage to the metal target to sputter the center portion of the semiconductor wafer, and then supplies DC voltage to the metal coil to sputter the peripheral portion of the semiconductor wafer.

3. The device of claim 1 wherein the voltage controller further supplies AC (alternating current) voltage of radio frequency to the metal coil when sputtering the center portion of the semiconductor wafer over which the AC voltage increases collisions between the Ar ions and the released metal atoms so as to ionize the released metal atoms whereby the ionized metal atoms have better gap-filling capability when sputtering the semiconductor wafer.

4. The device of claim 3 wherein the frequency of the AC voltage is 13.56 MHz and the power of the AC voltage is between 100 to 500W.

5. The device of claim 1 wherein the metal target is made of copper (Cu), titanium (Ti) aluminum (Al) or tantalum (Ta).

6. The device of claim 1 wherein the air pressure of the vacuum is maintained between 30 to 50 mTorr during the PVD processing.

7. The device of claim 1 wherein the DC voltages supplied by the voltage controller to the metal coil, the metal target and the wafer chuck are −100 to −300 volts, −500 to −1000 volts and −100 to −300 volts, respectively.

* * * * *